United States Patent
Yang

(10) Patent No.: US 9,634,180 B2
(45) Date of Patent: Apr. 25, 2017

(54) METHOD FOR FORMING SEMICONDUCTOR DEVICE PACKAGE WITH SLANTING STRUCTURES

(71) Applicant: King Dragon International Inc., Tortola (BV)

(72) Inventor: Wen Kun Yang, Hsin-Chu (TW)

(73) Assignee: KING DRAGON INTERNATIONAL INC., Tortola (VG)

( * ) Notice: Subject to any disclaimer, the term of this patent is extended or adjusted under 35 U.S.C. 154(b) by 0 days.

(21) Appl. No.: 14/578,483

(22) Filed: Dec. 21, 2014

(65) Prior Publication Data

US 2015/0111327 A1  Apr. 23, 2015

Related U.S. Application Data

(63) Continuation of application No. 13/848,602, filed on Mar. 21, 2013, now abandoned, which is a (Continued)

(51) Int. Cl.
   *H01L 33/62* (2010.01)
   *H01L 33/60* (2010.01)
   (Continued)

(52) U.S. Cl.
   CPC ........ *H01L 33/005* (2013.01); *H01L 23/3677* (2013.01); *H01L 23/49827* (2013.01);
   (Continued)

(58) Field of Classification Search
   CPC ........ H01L 24/83; H01L 33/60; H01L 33/62; H01L 33/382; H01L 33/387; H01L 33/405; H01L 33/00; H01L 33/005; H01L 2933/0033; H01L 2933/0058; H01L 2933/0066; H01L 23/3677; H01L 23/3142; H01L 23/481; H01L 23/49827; H01L 24/24–24/33; H01L 24/82; H01L 24/92; H01L 2924/12042; H01L 2924/15747; H01L 2924/15151; H01L 2224/92244; H01L 2224/2518; H01L 2224/83855; H01L 2224/24225; H01L 2224/32245;
   (Continued)

(56) References Cited

U.S. PATENT DOCUMENTS 5,635,115 A * 6/1997 Konishi ................. G02B 3/005
                                              257/E21.502
8,283,681 B2 * 10/2012 Sakamoto ............. H01L 33/486
                                              257/88

(Continued)

*Primary Examiner* — Natalia Gondarenko
(74) *Attorney, Agent, or Firm* — Chih Feng Yeh; Huntington IP Consulting Co., Ltd.

(57) ABSTRACT

A method for forming semiconductor device package comprises providing a substrate with via contact pads and via through holes through said substrate, terminal pads on a bottom surface of said substrate and an exposed type through hole through said substrate. A die is provided with bonding pads thereon and an exposed type pad on a bottom surface of said die. A reflective layer is formed on an upper surface of the substrate. The die is adhered on the substrate. A dry film is formed on a top of the die as a slanting structure. A re-distribution layer conductive trace is formed by sputtering and E-plating on an upper surface of the slanting structure.

12 Claims, 3 Drawing Sheets

Related U.S. Application Data continuation-in-part of application No. 13/348,787, filed on Jan. 12, 2012, now abandoned.

(51) Int. Cl.

| | | |
|---|---|---|
| *H01L 33/00* | (2010.01) | |
| *H01L 23/498* | (2006.01) | |
| *H01L 23/00* | (2006.01) | |
| *H01L 23/367* | (2006.01) | |

(52) U.S. Cl.
CPC .............. *H01L 24/24* (2013.01); *H01L 24/25* (2013.01); *H01L 24/32* (2013.01); *H01L 24/82* (2013.01); *H01L 24/92* (2013.01); *H01L 33/60* (2013.01); *H01L 33/62* (2013.01); *H01L 2224/24225* (2013.01); *H01L 2224/24998* (2013.01); *H01L 2224/2518* (2013.01); *H01L 2224/32225* (2013.01); *H01L 2224/32245* (2013.01); *H01L 2224/73267* (2013.01); *H01L 2224/83855* (2013.01); *H01L 2224/92244* (2013.01); *H01L 2924/12042* (2013.01); *H01L 2924/15151* (2013.01); *H01L 2924/15747* (2013.01); *H01L 2933/0033* (2013.01); *H01L 2933/0058* (2013.01); *H01L 2933/0066* (2013.01)

(58) Field of Classification Search
CPC . H01L 2224/32225; H01L 2224/73267; H01L 2224/24998

USPC ............ 438/26, 27; 257/99, 98, 93, 96, 100, 257/762, E33.059, E33.066, E33.061, 257/E33.005, E21.502

See application file for complete search history.

(56) References Cited

U.S. PATENT DOCUMENTS

| | | | |
|---|---|---|---|
| 2006/0131597 A1* | 6/2006 | Lee | H01L 33/0079 257/98 |
| 2006/0284197 A1* | 12/2006 | Kaneko | B82Y 20/00 257/98 |
| 2008/0191237 A1* | 8/2008 | Andrews | H01L 33/52 257/100 |
| 2009/0008777 A1* | 1/2009 | Lin | H01L 23/5389 257/738 |
| 2009/0278162 A1* | 11/2009 | Wang | C03C 8/02 257/99 |
| 2009/0302334 A1* | 12/2009 | Yao | F21K 9/00 257/93 |
| 2010/0015742 A1* | 1/2010 | Fang | H01L 33/44 438/46 |
| 2010/0244083 A1* | 9/2010 | Kim | H01L 33/382 257/99 |
| 2011/0210358 A1* | 9/2011 | Kim | H01L 33/508 257/98 |

* cited by examiner

METHOD FOR FORMING SEMICONDUCTOR DEVICE PACKAGE WITH SLANTING STRUCTURES

CROSS-REFERENCE TO RELATED APPLICATIONS

The present application is a continuation application (CA) of U.S. application Ser. No. 13/848,602 filed on Mar. 21, 2013, which is a Continuation-in-Part application of U.S. application Ser. No. 13/348,787 filed on Jan. 12, 2012.

TECHNICAL FIELD OF THE DISCLOSURE

The present invention relates to a semiconductor device package, and more particularly to a semiconductor device package with slanting structures formed adjacently to the die.

BACKGROUND OF RELATED ART

In the field of semiconductor devices, the device density is increased and the device dimension is reduced, continuously. The demand for the packaging or interconnecting techniques in such high density devices is also increased to fit the situation mentioned above. Flat no-leads packages such as QFN (quad-flat no-leads) and DFN (dual-flat no-leads) physically and electrically connect integrated circuits to printed circuit boards. Flat no-leads, also known as Micro-Lead-Frame and SON (small-outline no leads), is a surface-mount technology, one of several package technologies that connect ICs to the surfaces of PCBs without through-holes. Flat no-lead is a near chip scale package plastic encapsulated package made with a planar copper lead frame substrate. Perimeter lands on the package bottom provide electrical connections to the PCB. Flat no-lead packages include an exposed thermal pad to improve heat transfer out of the IC (into the PCB). Heat transfer can be further facilitated by metal vias in the thermal pad. The QFN package is similar to the quad-flat package, and a ball grid array.

Two types of QFN packages are common: air-cavity QFNs, with an air cavity designed into the package, and plastic-molded QFNs with air in the package minimized. Less-expensive plastic-molded QFNs usually limited to applications up to ~2-3 GHz. It is usually composed of just 2 parts, a plastic compound and copper lead frame, and does not come with a lid. In contrast, the air-cavity QFN is usually made up of 3 parts; a copper lead-frame, plastic-molded body (open, and not sealed), and either a ceramic or plastic lid. It is usually more expensive due to its construction, and can be used for microwave applications up to 20-25 GHz. QFN packages can have a single row of contacts or a double row of contacts. The QFN package is similar to the Quad Flat Package, but the leads do not extend out from the package sides. It is hence difficult to hand-solder a QFN package. A QFN package is very similar to a Ball grid array (BGA), except that the QFN uses landing pads, and solder paste is required to mount a QFN package onto the PCB. A BGA-package does not require any solder as the balls will melt and make contact with the PCB.

Different manufacturers use different names for this package: ML (micro-lead-frame) versus FN (flat no-lead), in addition there are versions with pads on all four sides (quad) and pads on just two sides (dual), and various thickness varying between 0.9-1.0 mm for normal packages and 0.4 mm for extreme thin.

For example, Micro lead-frame package (MLP) is a family of integrated circuit QFN packages, used in surface mounted electronic circuits designs. It is available in 3 versions which are MLPQ (Q stands for quad), MLPM (M stands for micro), and MLPD (D stands for dual). These packages generally have an exposed die attach pad to improve thermal performance. This package is similar to chip scale packages (CSP) in construction. MLPD are designed to provide a footprint-compatible replacement for small-outline integrated circuit (SOIC) packages.

MicroLeadFrame (QFN—Quad Flat No-Lead package) is a near CSP plastic encapsulated package with a copper lead-frame substrate. This package uses perimeter lands on the bottom of the package to provide electrical contact to the printed circuit board. The die attach paddle is exposed on the bottom of the package surface to provide an efficient heat path when soldered directly to the circuit board. This also enables stable ground by use of down bonds or by electrical connection through a conductive die attach material. Based on this package structure, it still has the die attached material formed between the die back and lead frame, and the high thermal resistance comes from the die attached materials itself.

A more recent design variation which allows for higher density connections is the Dual Row MicroLeadFrame (DRMLF) package. This is an MLF package with 2 rows of lands for devices requiring up to 164 I/O. Typical applications include hard disk drives, USB controllers, and Wireless LAN.

SUMMARY

One object of the present invention is to provide a semiconductor device package with slanting structures, thereby improving the package form factor to reduce the thickness of package body as thinner than 0.4 um due to no wire swing needed by using the RDL method instead of wire bonding method.

Another object of the present invention is to provide a semiconductor device package structure with conductive through holes from the top surface to the bottom surface of the substrate, thereby improving the efficiency and scaling down the size of the device.

Another object of the present invention is to provide a semiconductor device package structure with thermal metal pads which directly contact the chip back site without any die attached materials inside, thereby improving the thermal conductivity to reduce the thermal resistance and reducing the device junction temperature, especially for the high power device.

In one aspect, the present invention provides a semiconductor device package structure. The semiconductor device package structure includes a substrate with a via contact pad on top surface of the substrate, a terminal pad on bottom surface of the substrate and a conductive through hole through the substrate, wherein the conductive through hole electrically couples the via contact pad and the terminal pad on the substrate; a die having bonding pads thereon, wherein the die is formed on the top surface of the substrate; a slanting structure formed adjacent to at least one side of the die for carrying conductive traces; and a conductive trace formed on upper surface of the slanting structure to offer the electrical path between the bonding pads and the via contact pad.

In another aspect, the present invention provides a semiconductor device package structure. The semiconductor device package structure includes a substrate with via contact pads and via through holes through the substrate, terminal pads on a bottom surface of the substrate and an exposed type through hole through the substrate; a die having bonding pads thereon and an exposed type pad on a bottom surface of the die, wherein the exposed type pad is aligned with the exposed type through hole, wherein the die is formed on a top surface of the substrate; a reflective layer formed on an upper surface of the substrate; a slanting structure formed adjacent to at least one side of the die; and a conductive trace formed on an upper surface of the slanting structure to offer the electrical path between the bonding pads and the via contact pads, wherein the slanting structure is configured for carrying the conductive trace.

The package structure further comprises a first refilling material within the via through holes to form conductive through holes, wherein the conductive through holes are electrically coupled to the via contact pads and the terminal pads on the substrate; a second refilling material within the exposed type through hole to form a contact structure; an exposed type pad formed between a backside surface of the die and a top surface of the contact structure; a second contact pad formed on a backside surface of the contact structure.

BRIEF DESCRIPTION OF THE DRAWINGS

The present invention may be understood by some preferred embodiments and detailed descriptions in the specification and the attached drawings below. The identical reference numbers in the drawings refer to the same components in the present invention. However, it should be appreciated that all the preferred embodiments of the present invention are provided only for illustrating but not for limiting the scope of the Claims and wherein:

DETAILED DESCRIPTION

The present invention will now be described with the preferred embodiments and aspects and these descriptions interpret structure and procedures of the present invention only for illustrating but not for limiting the Claims of the present invention. Therefore, except the preferred embodiments in the specification, the present invention may also be widely used in other embodiments.

Figure 1:
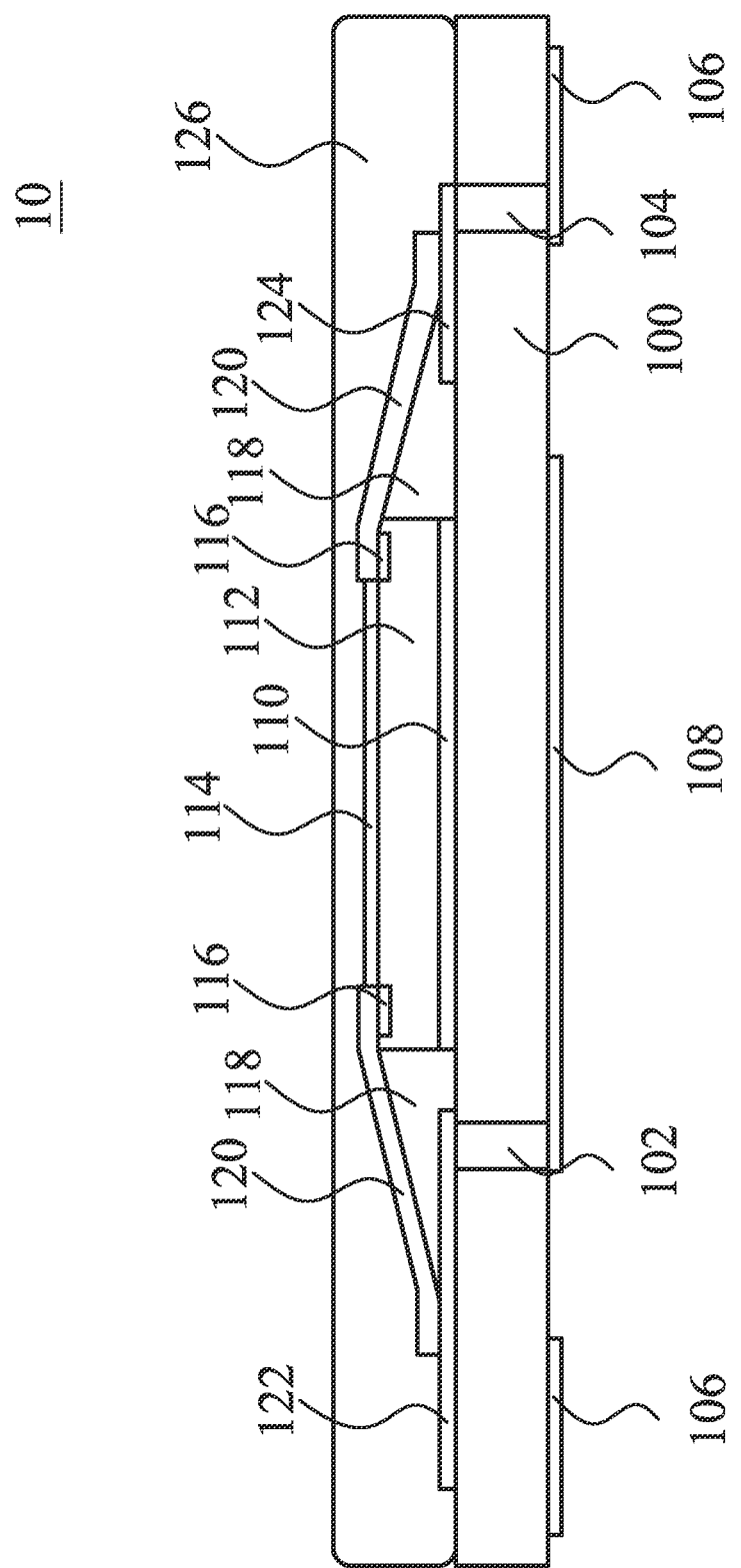
FIG. 1 illustrates a cross-sectional view of a semiconductor device package in accordance with one embodiment of the present invention.

FIG. 1 is cross-sectional view of a semiconductor device package 10 for QFN (quad-flat no-leads) package. The semiconductor device package 10 has a substrate 100 with predetermined through-holes 102 and 104 formed therein. The material of the substrate 100 may be a metal, glass, ceramic, silicon, plastic, BT (bismaleimide triazine), FR4, FR5 or PI (polyimide) etc. In one embodiment, the thickness of the substrate 100 may be about 40-200 micron-meters. It may be a single or multi-layer (wiring circuit) substrate.

A die 112 with bonding pads 116 thereon is subsequently adhered on the upper surface of the substrate 100 by the adhesive layer 110. The adhesive layer 110 may only cover the die size area. The bonding pads 116 are formed on the upper surface of the die 112 and adjacent to the edge of the die 112. (As the application's point of view, the bonding pads of the chip may be formed at any place of the top surface of the chip.) In one embodiment, the material of the bonding pads 116 may be alloy or metal, such as aluminum. A dielectric layer 114 is formed on the upper surface of the die 112 except the area above the bonding pads 116. Via contact pads 122, 124 are formed on the upper surface of the substrate 100 while the terminal pads 106 and the terminal pad 108 are formed on the lower surface of the substrate 100. In one embodiment, the material of the terminal pad 108 and the terminal pad 106 may be metal or alloy, such as Cu/Ni/Au. In one embodiment, the terminal pad 108 may be aligned with the die 112.

A photo-resist layer (not shown) is patterned by lithography process to form a desired wiring pattern on the backside surface of the substrate 100 to act as the thermal pads or terminal pads 106, 108. A refilling material is formed within the through-holes 102, 104 to form the conductive through hole structures. In one embodiment, the refilling material may be aluminum, titanium, copper, nickel, silver or the combination thereof. Some of the terminal pads 106 and the terminal pad 108 may be connected to the refilling material through holes 102, 104 as shown in FIG. 1. After the traces are defined, the photo-resist layer is stripped away by solution. The deposition of the refilling material for the through-holes 102, 104 is preferably formed by the Electrolyte-plating process as known in the art.

The through holes can be formed within the substrate 100 by laser, mechanical drill, or etching. The bonding pads 116 may be coupled to the terminal pads 106 and the terminal pad 108 via the conductive traces 120 (which will be described below), the via contact pads 122, 124 and the refilling material through holes 102, 104. As shown in FIG. 1, the refilling material through holes (also refer to interconnecting structures) 102, 104 are coupled to the terminal pads 106 and the terminal pad 108 respectively. Traces (not shown) may be configured on the lower or upper surface of the substrate 100. The present invention may squeeze the size of the package. The size of the open window of the through hole 102 is smaller than the die size. The die is typically picked and placed on the substrate with die face up configuration on the adhesive layer 110 by tool, followed by curing the adhesive layer 110.

With reference to FIG. 1, a slanting structure 118 is formed adjacent to at least one side of the die 112 for carrying conductive traces. In one embodiment of the present invention, the slanting structure 118 may be formed adjacent to both sides (or four sides) of the die 112. The conductive traces 120 are formed on the upper surface of the slanting structure 118 to offer smoother path between the bonding pads 116 and the via contact pad 122, 124 over the refilling material through holes 102, 104. The thickness of the slanting structure 118 is gradually reduced from the edge of the die 112, and the angle between the slanting structure 118 and the substrate 100 is about 15-75 degrees to offer smoother surface, thereby enhancing the physical strength of the conductive traces 120 formed thereon and preventing the conductive traces 120 from deforming by external force during the formation of the package, such as the formation of the cover layer 126. In one embodiment, the material of the conductive traces 120 may be alloy or metal, such as copper. The bonding pads 116 are formed on the die 112 and are connected to the via contact pads 122, 124 through the conductive traces 120 over the slanting structure 118, and the via contact pads 122 and 124 are coupled to the terminal pad 108 and the terminal pads 106 through the refilling material through holes 102 and 104 respectively. In one embodiment of the present invention, the via contact pad 122 is coupled to the terminal pad 108 through the refilling material through hole 102. In one embodiment of the present invention, the via contact pad 124 is coupled to one of the terminal pads 106 through the refilling material through hole 104. A cover layer 126 is formed on the dielectric layer 114, the conductive traces 120, the via contact pads 122, 124 and the substrate 100 to protect the semiconductor device package.

Figure 2:
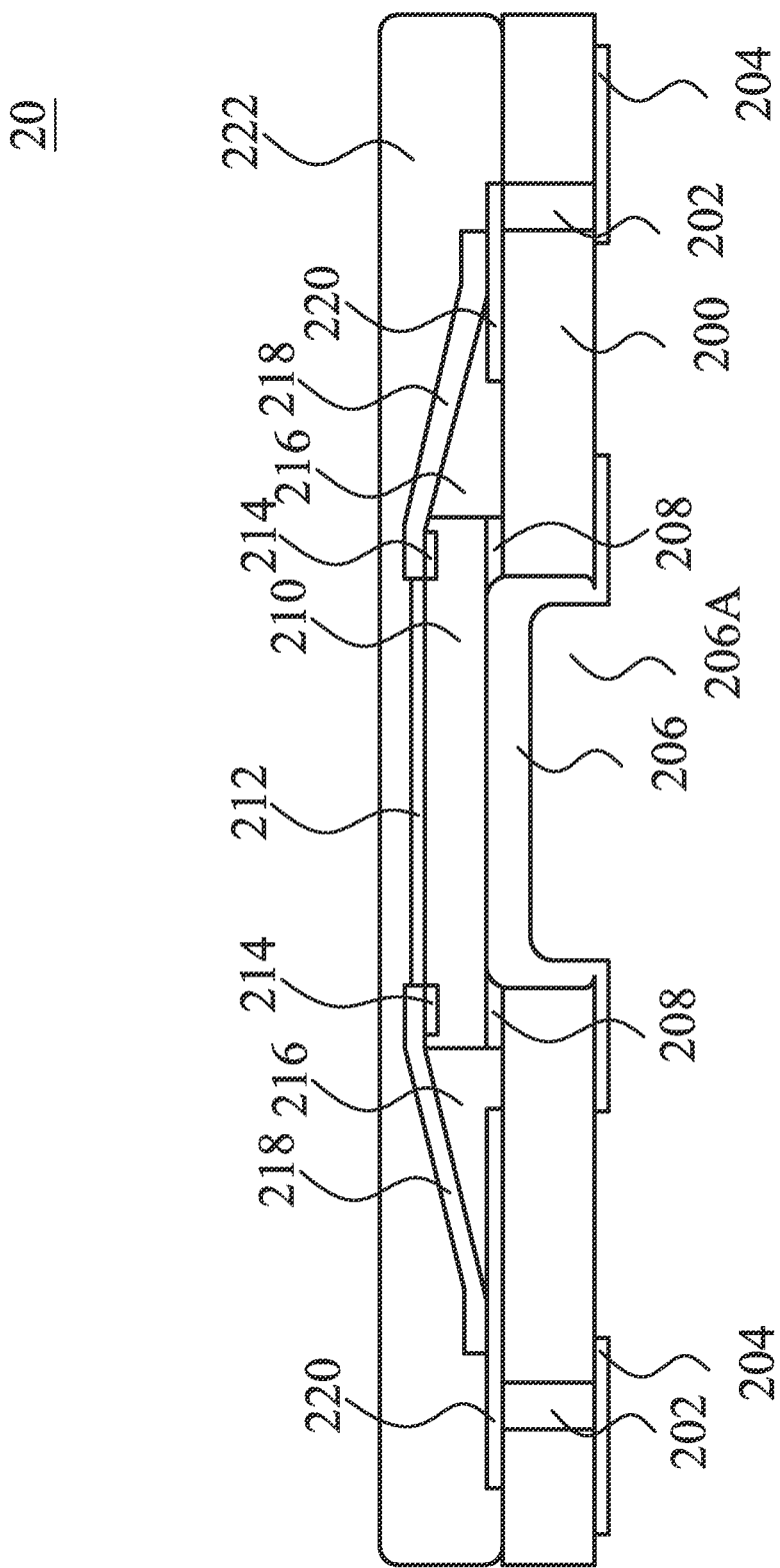
FIG. 2 illustrates a cross-sectional view of a semiconductor device package in accordance with another embodiment of the present invention.

With reference to FIG. 2, in another embodiment of the present invention, the present invention provides another semiconductor device package 20, in which the via contact pads 220 are coupled to the terminal pad 204 through the refilling material through holes 202. The semiconductor device package shown in FIG. 2 may be employed in high power situation. The substrate 200, the terminal pads 204, the adhesive layer 208, the die 210, the dielectric layer 212, the bonding pads 214, the slanting structure 216, the conductive traces 218, the via contact pads 220 and the cover layer 222 in FIG. 2 are similar to the corresponding elements of the last embodiment, such as the substrate 100, the terminal pads 106, the adhesive layer 110, the die 112, the dielectric layer 114, the bonding pads 116, the slanting structure 118, the conductive traces 120, the via contact pads 122, 124 and the cover layer 126 in FIG. 1. Therefore, the detailed description thereof is omitted and may refer to the above description related to FIG. 1. As shown in FIG. 2, a cavity 206A is formed from the bottom surface of the substrate 200 to the top surface of the substrate 200 to expose the backside surface of the die 210. A contact structure 206 is formed within the cavity 206A and along the surface of the cavity 206A and contacts the adhesive layer 208 to directly contact the lower (backside) surface of the die 210, so as to conduct the heat generated by the die 210, thereby reducing the thermal resistance and improving the thermal dissipation. In one embodiment, the contact structure 206 may be formed by sputtering and/or E-plating process. In one embodiment, the material of the contact structure 206 may be metal, such as copper which is preferred for better thermal conductivity and electricity.

Figure 3:
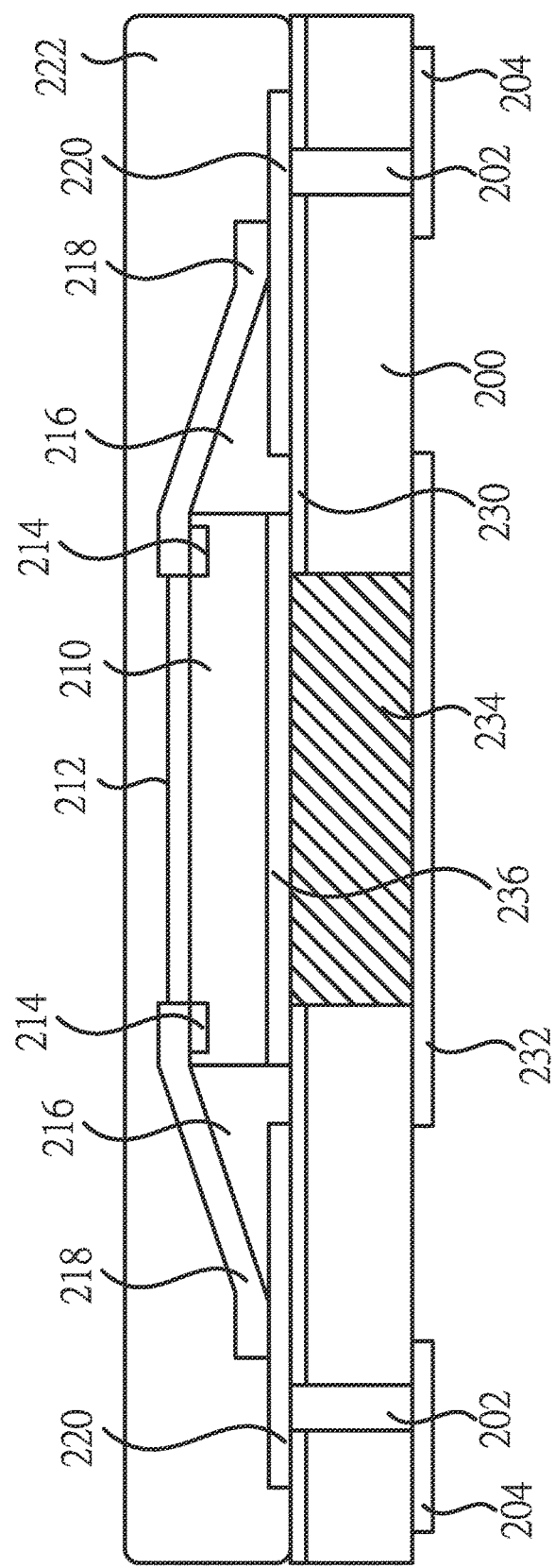
FIG. 3 illustrates a cross-sectional view of semiconductor device package in accordance with one embodiment of the present invention.

With reference to FIG. 3, in yet another embodiment of the present invention, the present invention provides another semiconductor device package 30, in which the via contact pads 220 are coupled to the terminal pad 204 through the refilling material through holes 202. The semiconductor device package shown in FIG. 3 may be employed in high power situation that includes the LED optical device. The substrate 200, the refilling material through holes 202, the terminal pads 204, the die 210, the dielectric layer 212, the bonding pads 214, the slanting structure 216, the conductive traces 218, the via contact pads 220 and the cover layer 222 in FIG. 3 are identical to the corresponding elements in FIG. 2. Therefore, the detailed description thereof is omitted and may refer to the above description related to FIG. 2. Moreover, for LED device, the dielectric layer 212 may be omitted. In one example, for LED device, the cover layer 222 will be replaced by the lens with phosphor structure. In this embodiment, a reflective layer 230 is formed on upper surface of the substrate 200 for LED optical device. A refilling material is filled within via through holes to form the refilling material through holes 202. The refilling material through holes 202 is formed through the substrate 200 and the reflective layer 230. In this embodiment, the adhesive layer (die attached material) maybe no need between backside of the die 210 and upper surface of the reflective layer 230. The LED die substrate may be a sapphire substrate, then, it may need the reflective layer 230 inside the exposed type pad 236. In this embodiment, the substrate 200 has a contact pad 232 and an exposed type through hole (TH) through the substrate 200 and the reflective layer 230, and terminal pads 204 formed on bottom surface of the substrate 200. A refilling material is filled into the exposed type through hole (TH) to form a conductive through hole (TH) structure 234 as a contact structure through the substrate 200 and the reflective layer 230, wherein the conductive through hole (TH) structure 234 is electrically coupled to the contact pad 232 on the bottom surface of the substrate 200 and the exposed type pad 236. The exposed type pad 236 may be as a thermal contact pad. The contact pad 232 is greatly larger than the via contacts pad 220. The LED die 210 has bonding pads (P&N) 214 on upper surface of the LED die 210 and exposed type pads 236 on bottom surface of the LED die 210, wherein the exposed type pads 236 is aligned with the exposed conductive through hole (TH) 234. As shown in FIG. 3, another through hole is formed from the bottom surface of the substrate 200 to the bottom surface of the exposed type pads 236 to expose the backside surface of the exposed type pads 236. The conductive through hole (TH) structure 234 is formed by sputtering seed metal (for example Ti/Cu) inside the through hole to contact the exposed type pads 236 which is directly contacting with the lower (backside) surface of the die 210, so as to conduct the heat generated by the die 210, and thereby reducing the thermal resistance and improving the thermal dissipation. In one embodiment, the conductive through hole (TH) structure 234 may be formed by sputtering metal (for example Ti/Cu) and/or Electrolyte-plating process. In one embodiment, the material of the conductive through hole (TH) structure 234 is preferred for better thermal conductivity and electricity.

The arrangement and configuration in the present invention may offer simpler and smoother signal traces for the chip, thereby improving the performance of the semiconductor device. The slanting structure 118, 216 with the conductive traces 120, 218, such as RDL, may replace the conventional bonding wires structure to provide better strength for better reliability in thermal mechanical stress condition. The dielectric layer for the slanting structure is dry film type, and is formed under the vacuum, high temperature and bonding condition. For instance, the thickness of the die may be about 100 um, and dry film is about 35 um, and once the dry film is formed on the top of die under the high vacuum and high temperature condition, then, the dry film will flow to the die edge with the elastic property of the material, it will force the dry film to fill out the slope area adjacent to the die. The condition is as following: vacuum 1E-1 to 1E-2 torr; temperature ~70 to 110 centigrade.

The refilling material in the through holes and the terminal pads offer shorter distance for signal transmission, and better thermal conductivity. The thermal metal pads are easy to be formed; it offers lowest thermal resistance. Alternatively, the refilling material by plating is formed by sputtering, Electrolyte-plating the Cu/Ni/Au.

The foregoing description is a preferred embodiment of the present invention. It should be appreciated that this embodiment is described for purposes of illustration only, not for limiting, and that numerous alterations and modifications may be practiced by those skilled in the art without departing from the spirit and scope of the present invention. It is intended that all such modifications and alterations are included insofar as they come within the scope of the present invention as claimed or the equivalents thereof.

What is claimed is:

1. A method for forming semiconductor device package, comprising providing a substrate with via contact pads and via through holes through said substrate, terminal pads on a bottom surface of said substrate and an exposed type through hole through said substrate, wherein said exposed type through hole was filled with a second refilling material for forming a contact structure;

providing a die having bonding pads thereon and a thermal contact pad on a bottom surface of said die, wherein said thermal contact pad is aligned with said exposed type through hole, wherein said die is formed on a top surface of said substrate, and said thermal contact pad is formed between a backside surface of said die and a top surface of said contact structure, said second refilling material conducts heat generated by said die for reducing a thermal resistance;

wherein forming said die on the top surface of said substrate comprises:

forming a reflective layer on an upper surface of said substrate;

adhering said die directly on a top surface of said reflective layer and the top surface of said contact structure:

forming a film on a top of said die under a vacuum in a range of 1 E-1 to 1 E-2 Torr and a temperature in a range of 70 to 110 degree centigrade, said film flowing to an edge of said die to fill out a slope area adjacent to said die to form a slanting structure; and forming a re-distribution layer conductive trace by sputtering and Electrolyte-plating on an upper surface of said slanting structure to offer path between said bonding pads of said die and said via contact pads of said substrate, wherein said slanting structure is in direct contact with sidewalls of said die, said thermal contact pad, the top surface of said reflective layer, and said via contact pads of said substrate.

2. The method of claim 1, further comprising filling a first refilling material within said via through holes to form conductive through holes, wherein said conductive through holes are electrically coupled to said via contact pads and said terminal pads on said substrate.

3. The method of claim 1, wherein said second refilling material comprises aluminum, titanium, copper, nickel, silver or the combination thereof.

4. The method of claim 1, further comprising forming a second contact pad on a backside surface of said contact structure.

5. The method of claim 1, further comprising forming a dielectric layer on an upper surface of said die.

6. The method of claim 5, further comprising forming a cover layer on said dielectric layer, said conductive trace, said via contact pads and said substrate.

7. The method of claim 5, further comprising forming a lens with phosphor structure on said dielectric layer, said conductive trace, said via contact pads and said substrate.

8. The method of claim 1, wherein material of said substrate comprises metal, glass, ceramic, silicon, plastic, bismaleimide triazine, FR4, FR5 or polyimide.

9. The method of claim 1, wherein said reflective layer includes organic film, metal or alloy.

10. The method of claim 1, wherein said reflective layer comprises Ag, Al or Au.

11. The method of claim 1, wherein said forming a reflective layer on an upper surface of said substrate is performed by a sputtering process or coating an organic film.

12. The method of claim 1, wherein a material of said re-distribution layer conductive trace comprises Cu/Ni/Au.

* * * * *